US007742893B2

(12) United States Patent
Confalonieri et al.

(10) Patent No.: US 7,742,893 B2
(45) Date of Patent: Jun. 22, 2010

(54) CALIBRATION CIRCUIT FOR CALIBRATING AN ADJUSTABLE CAPACITANCE OF AN INTEGRATED CIRCUIT HAVING A TIME CONSTANT DEPENDING ON SAID CAPACITANCE

(75) Inventors: Pierangelo Confalonieri, Caponago (IT); Riccardo Martignone, Carnate (IT); Marco Zamprogno, Cesano Maderno (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 297 days.

(21) Appl. No.: 12/035,308

(22) Filed: Feb. 21, 2008

(65) Prior Publication Data
US 2008/0221823 A1    Sep. 11, 2008

(30) Foreign Application Priority Data
Feb. 23, 2007    (EP)    ................................. 07425100

(51) Int. Cl.
*G01R 35/00*    (2006.01)
(52) U.S. Cl. ........................ 702/107; 702/117; 702/125; 327/306; 327/552; 327/553; 327/554; 327/558; 323/288; 307/110; 360/78.04; 360/75; 324/76.28; 324/158.1; 324/601
(58) Field of Classification Search ............... 702/89, 702/90, 91, 117, 125, 107, 106; 327/551, 327/557, 306, 563, 581, 553, 552, 554, 558, 327/344, 559; 323/288, 289; 326/93; 307/110; 360/78.04, 75; 331/108 R, 25, 34; 324/76.28, 324/158.1, 601
See application file for complete search history.

(56) References Cited

U.S. PATENT DOCUMENTS 4,818,903 A * 4/1989 Kawano ..................... 327/553

(Continued)

FOREIGN PATENT DOCUMENTS

GB    2 424 806    10/2006

(Continued)

OTHER PUBLICATIONS

Dehng, G., et al., "Clock-Deskew Buffer Using a SAR-Controlled Delay-Locked Loop," IEEE Journal of Solid-State Circuits, vol. 35, No. 8, Aug. 2000, pp. 1128-1136.

(Continued)

*Primary Examiner*—Carol S Tsai
(74) *Attorney, Agent, or Firm*—Lisa K. Jorgenson; Robert Iannucci; Seed IP Law Group PLLC

(57) ABSTRACT

A calibration circuit calibrates an adjustable capacitance of a circuit having a time constant depending on the adjustable capacitance. The calibration circuit outputs a calibration signal carrying information for calibrating the capacitor and includes a calibration loop. The calibration circuit includes: a controllable capacitance unit suitable to receive a control signal and including at least one array of switched capacitors that can be activated by the control signal, the unit being such as to output a first signal characterized by a parameter depending on the amount of capacitance of the array activated by the control signal; a comparison unit suitable to receive the first signal to assess whether the parameter meets a preset condition and to output a comparison signal representative of the assessment result; a control and timing logic unit suitable to receive the comparison signal to change this control signal based on the comparison signal, characterized in that the first signal is a logic signal and the parameter is a time parameter of the first signal.

17 Claims, 5 Drawing Sheets

U.S. PATENT DOCUMENTS

| | | | | |
|---|---|---|---|---|
| 4,851,719 A * | 7/1989 | Hitomi | | 327/58 |
| 5,124,593 A * | 6/1992 | Michel | | 327/554 |
| 5,345,119 A * | 9/1994 | Khoury | | 327/553 |
| 5,796,545 A * | 8/1998 | Canclini | | 360/78.04 |
| 6,710,644 B2 * | 3/2004 | Duncan et al. | | 327/558 |
| 6,803,813 B1 * | 10/2004 | Pham | | 327/553 |
| 6,885,181 B1 * | 4/2005 | Roo | | 324/76.28 |
| 6,981,414 B2 * | 1/2006 | Knowles et al. | | 73/504.12 |
| 7,078,961 B2 * | 7/2006 | Punzenberger et al. | | 327/553 |
| 7,411,799 B2 * | 8/2008 | Muggler et al. | | 363/60 |
| 7,578,163 B2 * | 8/2009 | Greidanus et al. | | 73/1.42 |
| 2002/0196052 A1 | 12/2002 | Furuya | | |
| 2004/0260500 A1 * | 12/2004 | Punzenberger et al. | | 702/107 |
| 2005/0212590 A1 | 9/2005 | Dong | | |
| 2005/0253646 A1 * | 11/2005 | Lin | | 327/553 |
| 2006/0132339 A1 * | 6/2006 | Alon et al. | | 341/120 |
| 2009/0051401 A1 * | 2/2009 | Confalonieri et al. | | 327/306 |

FOREIGN PATENT DOCUMENTS

| | | |
|---|---|---|
| JP | 4-207521 | 7/1992 |
| JP | 2003-347901 | 12/2003 |

OTHER PUBLICATIONS

Khalil, W., et al., "A Highly Integrated Analog Front-End for 3G," IEEE Journal of Solid-State Circuits, vol. 38, No. 5, May 2003, pp. 774-781.

\* cited by examiner

US 7,742,893 B2

CALIBRATION CIRCUIT FOR CALIBRATING AN ADJUSTABLE CAPACITANCE OF AN INTEGRATED CIRCUIT HAVING A TIME CONSTANT DEPENDING ON SAID CAPACITANCE

TECHNICAL FIELD

The present disclosure generally relates to the technical field of calibration systems, and particularly but not exclusively relates to a calibration circuit for calibrating an adjustable capacitance of an integrated circuit having a time constant depending on this capacitance.

BACKGROUND INFORMATION

In the field of integrated circuits, the need is felt for providing integrated circuits having a preset time constant depending on the product RC of a capacitance value C by a resistance value R.

For example, in the state of the art, it is known to provide integrated circuits of which the cut-off frequency is a linear (particularly, inversely proportional) function of the product RC of a resistance R by a capacitance C. The process for producing these integrated circuits has inherent variations such that the product RC obtained can sensibly differ from the desired product RC. In some cases, the variations can be as high as 40% or 50% in module and this entails that there may also be a factor of 3 between the lowest and highest cut-off frequencies of the filter achievable by the manufacturing process.

This gives rise to a problem, for example with a low-pass filter, in that:
  when the effective cut-off frequency of the filter is higher than the desired value, the filter can let undesired noise pass therethrough, mainly when the latter is present about the desired cut-off frequency;
  on the contrary, when the effective cut-off frequency of the filter is lower than the desired value, the useful signal is dampened.

To solve these problems, several solutions have been developed in the art, which provide carrying out, after the integration process, the so-called trimming of the wafers on which the circuits are made. However, these solutions suffer from high costs in terms of additional area occupied, in terms of time required for testing the circuits, and further offer poor reliability. Furthermore, in some cases, these solutions are not feasible, mainly because the productive technology applied not always provides for the components required for implementing these solutions.

An alternative solution to that of the above-mentioned prior art has been published in "IEEE JOURNAL OF SOLID-STATE CIRCUITS", vol 38, No. 5, May 2003, in the article "A Highly Integrated Analog Front-End for 3G", and provides a self-adjusting circuit that, as compared with the trimming solutions described above, has lower consumptions and lower area costs.

The self-adjusting circuit of the above-cited article is schematically represented in FIG. 1, in which it is generally designated with 1. In the article, the self-adjusting circuit 1, or calibration circuit 1, is used for adjusting the time constant RC of a low-pass filter 2, and is such to provide a calibration signal to this filter via the bus REG_BUS. The low-pass filter 2 is such as to receive an input signal to be filtered I_sig to output a corresponding filtered signal F_sig.

The calibration circuit 1 includes a calibration loop comprising a switched capacitor array C_AR, an analog comparator CMP, a control and timing logic unit TG_CNT and an interruption element SW_Res controllable by a signal Res_C and suitable to reset the switched capacitor array C_AR by short-circuiting the latter to ground.

The array switched capacitors C_AR can be selectively switched via a signal provided by the control and timing unit TG_CNT to a bus C_BUS. The switched capacitor array C_AR is shown in FIG. 2a in greater detail.

In FIG. 2a, the array C_AR comprises four capacitors 8C, 4C, 2C, 1C, or modular capacitive elements, which are binary weighted relative to a unit capacitance of value C. The precision of the calibration circuit can be either increased or decreased by providing a higher or lower number of modular capacitive elements, respectively.

The symbols B3, B2, . . . , B0 indicate the bits of the control signal supplied to the array C_AR via the C_BUS, from the most significant bit to the least significant bit, respectively. By Sw3, . . . , Sw0 have been designated the capacitor switches, 8C, . . . , 1C, controlled by the respective bits B3, . . . , B0. These switches allow selectively connecting/disconnecting (i.e., enabling/disabling) the capacitors of the array C_AR to/from node 4, the voltage of the latter being designated with VRC in FIG. 1. It should be observed that the effective capacitance $C_{eff}$ in the capacitor array C_AR depends, in a given instant, on which and how many modular capacitive elements 8C, 4C, 2C, 1C are connected to the node 4 via the switches Sw3, . . . , Sw0. It should be also observed that the capacitor array C_AR comprises a fixed capacitor Cfx, which is the lowest capacitance value required for obtaining the calibration in the case where the product RC of the filter 2 such as obtained by the process has a highest value relative to the tolerance range normally ensured by the process. The total capacitance value which can be set in parallel with the fixed capacitor Cfx via the modular capacitive elements 8C, 4C, 2C, 1C must be established, on the contrary, such as to be capable of ensuring the granularity required by the calibration.

The calibration cycle carried out by the circuit in FIG. 1 is intended to identify by trial and error a control code B3, B2, B1, B0 (produced by the timing and control logic unit TG_CNT and provided thereby to the array C_AR via the bus C_BUS) which is such as to identify a set of array enabled capacitors C_AR such as to meet a preset calibration condition. At the end of the calibration cycle, the control code B3, B2, B1, B0 obtained is sent via the bus REG_BUS to the filter 2 and represents the calibration signal. In the filter 2, this code is applied to the adjustable capacitance $C_{var}$ in order to obtain a preset RC=R*$C_{var}$ product in the filter 2.

Waveforms illustrating the operation of the circuit in FIG. 1 are reported in FIG. 2b.

With reference to FIG. 1, 2a, 2b, the timing and control logic unit TG_CNT is such as to start a calibration cycle in response to a calibration-request signal C_REG and according to a timing imposed by a clock signal CK. At the beginning of each step of the calibration cycle, the timing and control logic unit TG_CNT is such as to short-circuit the array C_AR to ground, by closing the interruption element SW_Res, in order to discharge this array C_AR.

After the array has been discharged C_AR, the interruption element SW_Res is opened for a half-period of the clock signal and a certain number of modular capacitive elements 8C, . . . , 1C are connected to the node 4, by a selective closure of the switches Sw3, . . . , Sw0 that is commanded by the control code B3, . . . , B0.

These modular capacitive elements 8C, . . . , 1C start charging thus causing the voltage VRC of node 4 to increase according to a transient characterized by a time constant equal to RF*$C_{eff}$ and an asymptote given by the voltage Vcc. As stated above, $C_{eff}$ represents the effective capacitance value (including the fixed capacitance value Cfx) of the array C_AR which are connected to node 4 at a given instant.

In a clock half-period, when the voltage VRC of node 4 reaches a voltage higher than voltage VCMP=VCC*R2/(R1+R2), the analog comparator CMP will change its output state (in the example, the signal OUT_CMP will go from logic level "0" to logic level "1").

The clock signal CK is a clock having a known frequency and there exists only one product RF*$C_{eff}$ being such as to cause the voltage VRC to increase to the value VCMP in a half-period of clock signal CK. For this reason, the VCMP is set at a voltage value equal to the voltage that node VRC would achieve in a clock half-period according to a transient governed by a time constant 1/RC equal to, except for a scale factor, the desired value at which the time constant of filter 2 has to be calibrated.

In the particular circuit described in the above-cited article, the control codes sent from the timing logic unit TG_CNT to the array C_AR are generated by a counter of this unit, which is decremented at each step of the calibration cycle. This counter has a number of resolution bits equal to the number of the modular capacitive elements 8C, 4C, 2C, 1C that can be controlled by means of the control signal.

With particular reference to FIG. 2b, it should be observed that upon operation, before starting a calibration cycle, the signal RES_C short-circuits the capacitors Cfx, 8C, 4C, 2C, 1C of the array C_AR to earth until when the calibration cycle is started and the switches Sw3, . . . , Sw0 on the capacitors are such as to turn them off when they are driven with 0 or turn them on when they are driven with 1.

The switches Sw3, . . . , Sw0 are driven via the bits B3, . . . , B0 of the control code provided on the bus C_BUS. This code B3, . . . , B0 corresponds to the value of the unit counter TG_CNT. The counter, during the calibration cycle, is decremented from the initial value 15 (in the case of 4 bits) by a unit at each period of clock signal CK.

At each decrement of the counter there corresponds a decrease, within the array C_AR, by one capacitive unit.

The first attempt (or first step) of the calibration circuit is carried out with all the capacitors of the array C_AR being enabled. When the level reached by the voltage VRC in a half-period of the clock signal CK is lower than the value of the voltage VCMP, the counter will be decremented by one unit. Consequently, also the subsequent control code B3, . . . , B0 will decrease by one unit, and thus the total capacitance of the array C_AR will be decreased by one elementary capacitor. This occurs, however, only after the array C_AR has been previously short-circuited to earth by the interruption element SW_Res in the half-period subsequent to the attempt described above.

During the subsequent steps, the calibration cycle is carried out by unit decrements in the subsequent steps until when the voltage value VRC achieved in one half-period is higher than the voltage VCMP. In the latter case, the cycle ends and the value reached in the counter is stored, which value will be then used as the code to be applied to the filter for calibration and sent to the latter via the bus REG_BUS.

The prior art solution described above suffers from several drawbacks. Particularly, it requires a low-offset and fast comparator CMP, to avoid excessively penalizing the calibration precision, especially when the clock signal CK to be used is a high-frequency signal. This implies area occupation and additional power consumption and design difficulties.

BRIEF SUMMARY

An embodiment provides a calibration circuit which does not suffer from the drawback described above with reference to the prior art calibration circuit.

For example, the calibration circuit of one embodiment allows solving a further problem of the prior art calibration circuit. It has been observed, in fact, that in the circuit described in the above-cited article, the sequence of attempts carried out by the control and timing unit TG_CNT is monotonic, and thus the maximum time required for calibration is equal to 2**n periods, where n is the bit number of the counter. This time for determining the code REG_BUS is variable according to the value of the initial product between RF and $C_{eff}$, but in the destination of the time required, what is to be taken in consideration is the maximum time, e.g., 2*n clock cycles, and in several applications this can be unacceptable. The circuit of one embodiment solves this problem.

BRIEF DESCRIPTION OF THE SEVERAL VIEWS OF THE DRAWING(S)

Further features will appear more clearly from the detailed description below of one or more embodiments, which has been given by way of illustration, and should be not considered as limiting with relation to the annexed figures, in which.

Figure 3:
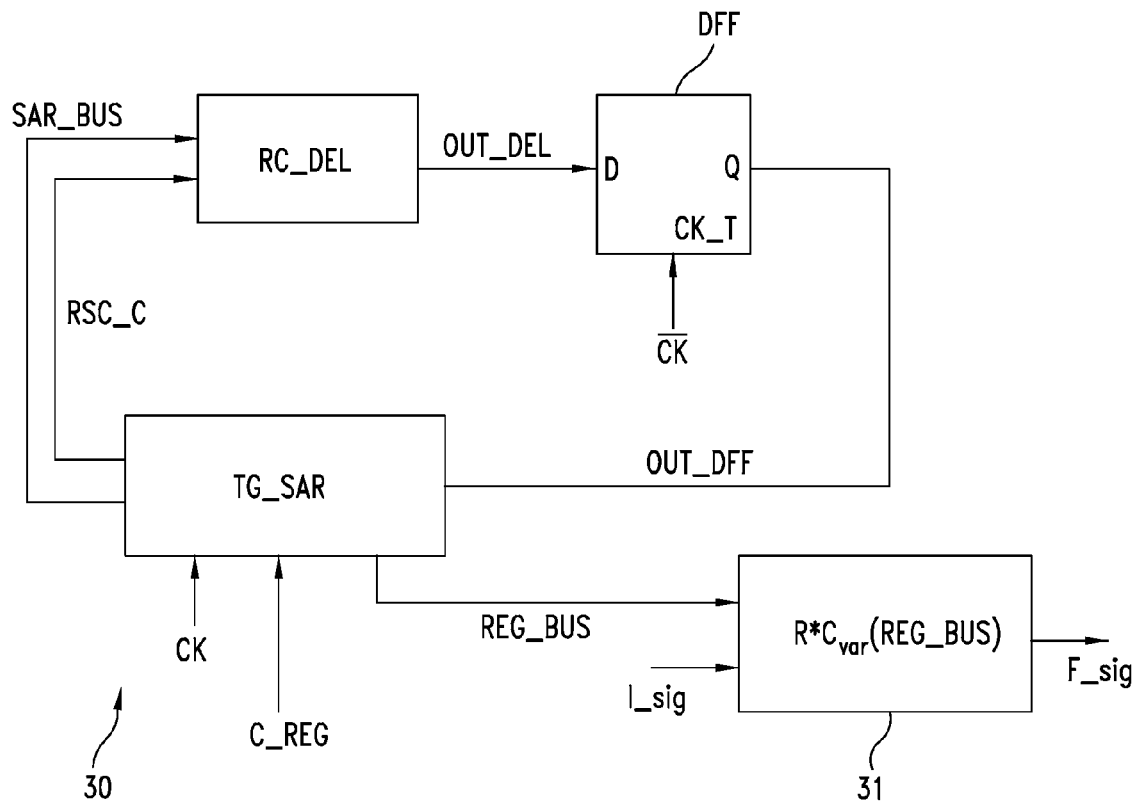
Figure 4A:
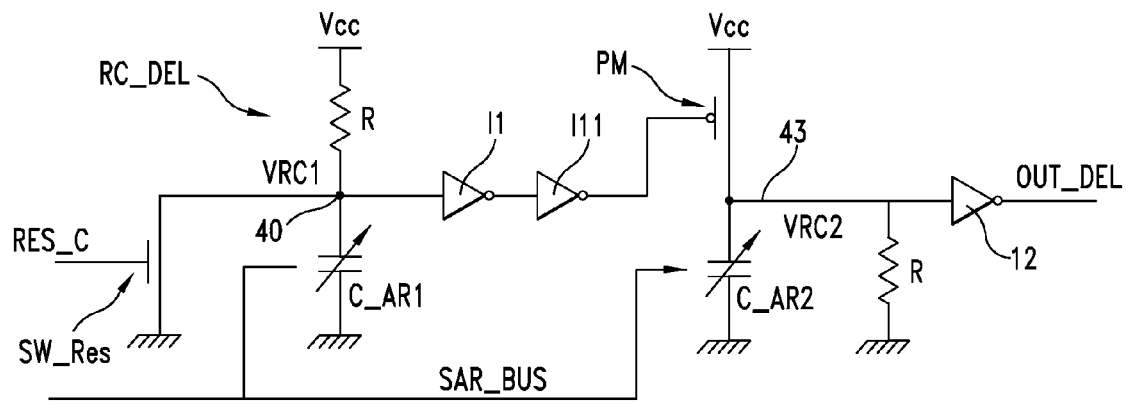
Figure 4B:
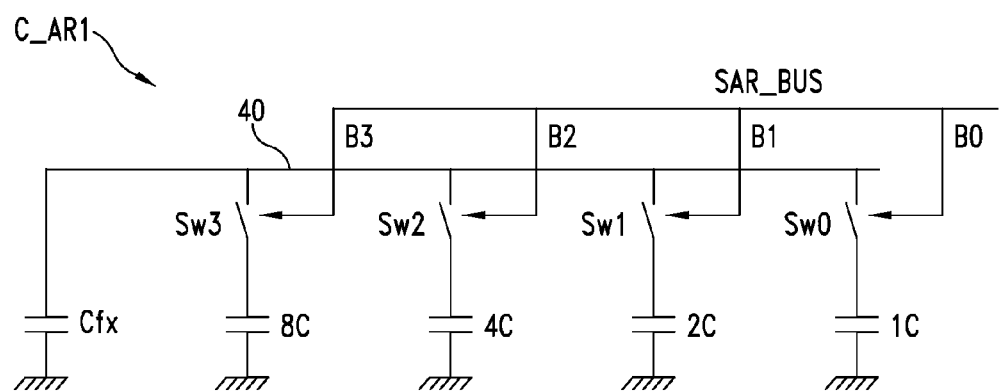
Figure 5:
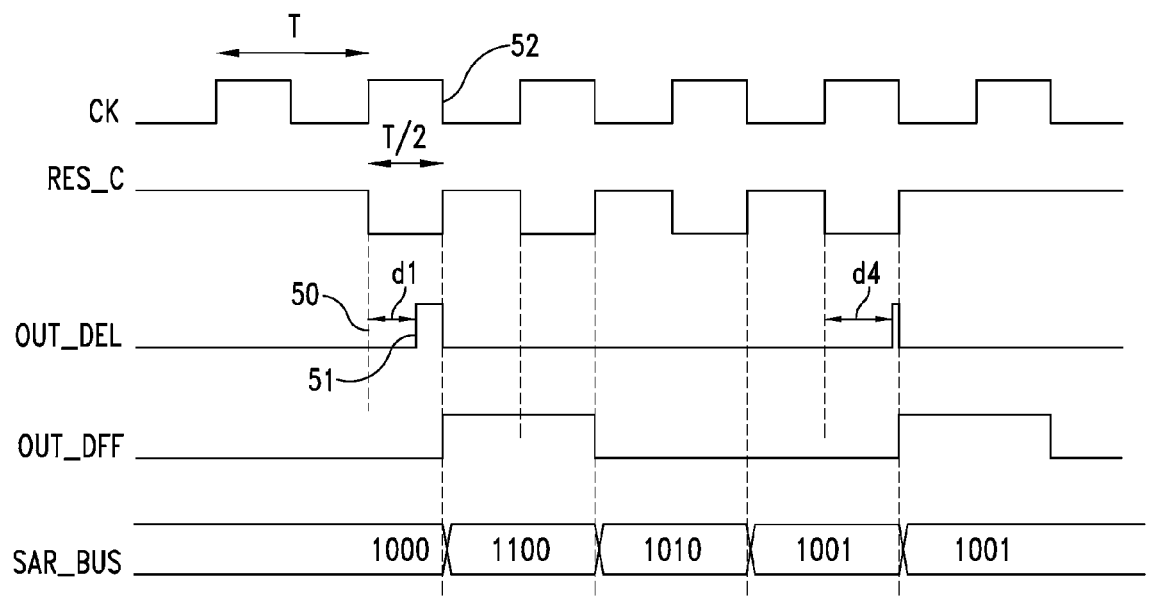

FIG. 3 schematically shows one embodiment of a calibration circuit;

FIG. 4a shows a part of the circuit in FIG. 3 in greater detail according to an embodiment;

FIG. 4b shows a part of the circuit in FIG. 4a in greater detail according to an embodiment; and FIG. 5 shows portions of example waveforms of signals involved in the operation of the circuit in FIG. 3 according to an embodiment.

In the figures, equal or similar elements will be designated with the same reference numerals.

DETAILED DESCRIPTION

In the following description, numerous specific details are given to provide a thorough understanding of embodiments. The embodiments can be practiced without one or more of the specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

FIG. 3 shows the functional block diagram of a calibration circuit 30 according to one embodiment. The circuit 30 in FIG. 3, at the end of a calibration cycle, is such as to output a calibration signal or code, and is such as to send this calibration signal, in the example via a bus REG_BUS, to an integrated circuit 31. By REG_BUS will be designated herein below, based on the context, both the calibration signal and the bus on which this signal is transmitted.

The integrated circuit 31 is a circuit having a time constant depending on the product $R*C_{var}(REG\_BUS)$ in which R is a value of a resistance and $C_{var}(REG\_BUS)$ is a value of a capacitance adjustable by the calibration signal, or code REG_BUS outputted from the calibration circuit 30. In the particular example that will be described below, the integrated circuit 31 will be assumed to be a filter, for example a low-pass filter, and having a cut-off frequency depending on the product $R*C_{var}(REG\_BUS)$. It should be considered, however, that the teachings of the embodiment(s) can be applied to the calibration of any integrated circuit 31 having a time constant depending on the product $R*C_{var}(REG\_BUS)$.

In the particular example illustrated herein, the filter 31 is such as to receive a signal I_sig to be filtered in order to output a filtered signal F_sig.

The calibration circuit 30 includes a calibration loop RC_DEL, DFF, TG_SAR for carrying out a calibration cycle in various sequential steps, or attempts.

The calibration loop comprises a controllable capacitance unit RC_DEL suitable to receive a control signal, in the example via the bus SAR_BUS.

By SAR_BUS will be designated herein below either the control signal or the bus on which this signal is transmitted, depending on the context.

The controllable capacitance unit RC_DEL includes at least one array of switched capacitors, which can be selectively activated or deactivated via the control signal SAR_BUS to output a logic signal OUT_DEL characterized by a time parameter depending on the total amount of capacitance of the array activated via the control signal SAR_BUS.

The calibration loop RC_DEL, DFF, TG_SAR, further includes a comparison unit DFF such as to receive the signal OUT_DEL in order to assess whether the time parameter of this signal meets a preset condition. As a result of the evaluation, the comparison unit DFF is such as to output a comparison signal OUT_DFF representative, at each step, of the calibration cycle of the assessment result.

The calibration loop RC_DEL, DFF, TG_SAR, further comprises a timing logic unit TG_SAR suitable to receive the comparison signal OUT_DFF and such as to change the control signal SAR_BUS for the controllable capacitance unit RC_DEL based on the result of the assessment carried out by the comparison unit DFF.

The logic and timing unit TG_SAR is also such as to supply the unit RC_DEL with a signal RES_C suitable to discharge the switched capacitor array of the unit RC_DEL prior to the beginning of each calibration step. More precisely, the signal RES_C is such as to reset, at the beginning of each calibration step, the capacitors of the switched capacitor array enabled by the control signal, i.e., those capacitors that will be used in the particular calibration step.

As illustrated in FIG. 3, the logic and timing unit TG_SAR is such as to receive a clock signal CK and a calibration cycle start request signal C_REG.

In a particular embodiment, the controllable capacitance unit RC_DEL comprises a delay circuit, suitable to produce an output signal OUT_DEL which has a delayed edge relative to a corresponding edge of the input signal RES_C. The delay between said edges is a function of the amount (i.e., value) of capacitor activated via the control signal SAR_BUS and is the time parameter of the signal OUT_DEL to be assessed via the comparison unit DFF, in order to ascertain that this delay meets a predetermined condition.

In a particular embodiment, the comparison unit DFF is such as to assess whether the delay of the signal OUT_DEL is lower or higher than a half-period of the clock signal CK, and to output a logic comparison signal OUT_DFF having a first preset logic level, such as the logic level "0", when this delay is higher than one half-period of the clock signal CK, and having, on the contrary, a second preset logic level, for example, the logic level "1".

In a particular embodiment, the comparison unit DFF, includes a digital comparator in the form of a D flip-flop, having a control input CK_T to receive the clock signal CK (or better, the negated version of this signal), a data input D suitable to receive the signal OUT_DEL and an output Q to provide the comparison signal OUT_DFF.

The target of a calibration cycle managed by the control and timing logic unit TG_SAR is to identify a control signal, or code SAR_BUS which is such as to switch, in the unit RC_DEL, an amount of effective capacitance $C_{eff}$ suitable to produce in signal OUT_DEL a delay which is as much proximate as possible to a half-period of clock signal CK. It is thus understood that the period of the clock signal CK, which is assumed to be known, is the reference for the calibration carried out by the circuit 30.

At the end of the calibration cycle, the logic and timing unit TG_SAR may supply a calibration signal REG_BUS to the filter 31, which is practically equal to the control signal or code SAR_BUS identified at the end of the calibration cycle.

As will be described below in greater detail, in a particular embodiment to be considered as non-limiting, the identification of the control signal REG_BUS, for the purposes stated above, is carried out by the control and timing unit TG_SAR by a successive approximation search technique, entirely similar to the so-called SAR (Successive Approximation Register) technique.

In this case, the control and timing unit TG_SAR includes a successive approximation register, the content thereof being:
  provided at each step of the calibration cycle as a control signal or code SAR_BUS for unit RC_DEL, and
  provided at the end of this calibration cycle as a calibration signal or code REG_BUS for the filter 31.

The SAR search strategy, also known as the binary search, has been used for a long time in the field of analog-to-digital converters, however, it appears that its use has been so far limited to searching voltage values, or current values at the most, and not extended to searching time parameters (such as, for example, delays).

In FIG. 4a is schematically shown a particular embodiment of a controllable capacitance unit RC_DEL which is such as to produce an output signal OUT_DEL having a delay depending on the amount of capacitance in the unit RC_DEL switched by the control signal SAR_BUS. It should be observed that, in the example in FIG. 4a, the unit RC_DEL is practically embodied by a delay circuit that is provided in accordance with the teachings of the European Patent Application published under EP 1 564 886 entitled "Delay Circuit".

The delay circuit RC_DEL in FIG. 4a practically has two cascade stages, each comprising an array of switched capacitors C_AR1 and C_AR2, which are entirely similar to each other, and controllable via the same control signal or code SAR_BUS. Each of the two stages has an inverter I1, I2, which are also identical to each other. In the circuit in FIG. 4a, the total delay of the signal OUT_DEL is equal to the sum of the delays introduced by the two stages, and thus is, accordingly to the teachings of the above-cited European Patent Application, advantageously insensitive to the trip voltage of the inverter I1. Consequently, this delay is essentially a function of the product of a resistance value R by a capacitance value C.

Figure 1:
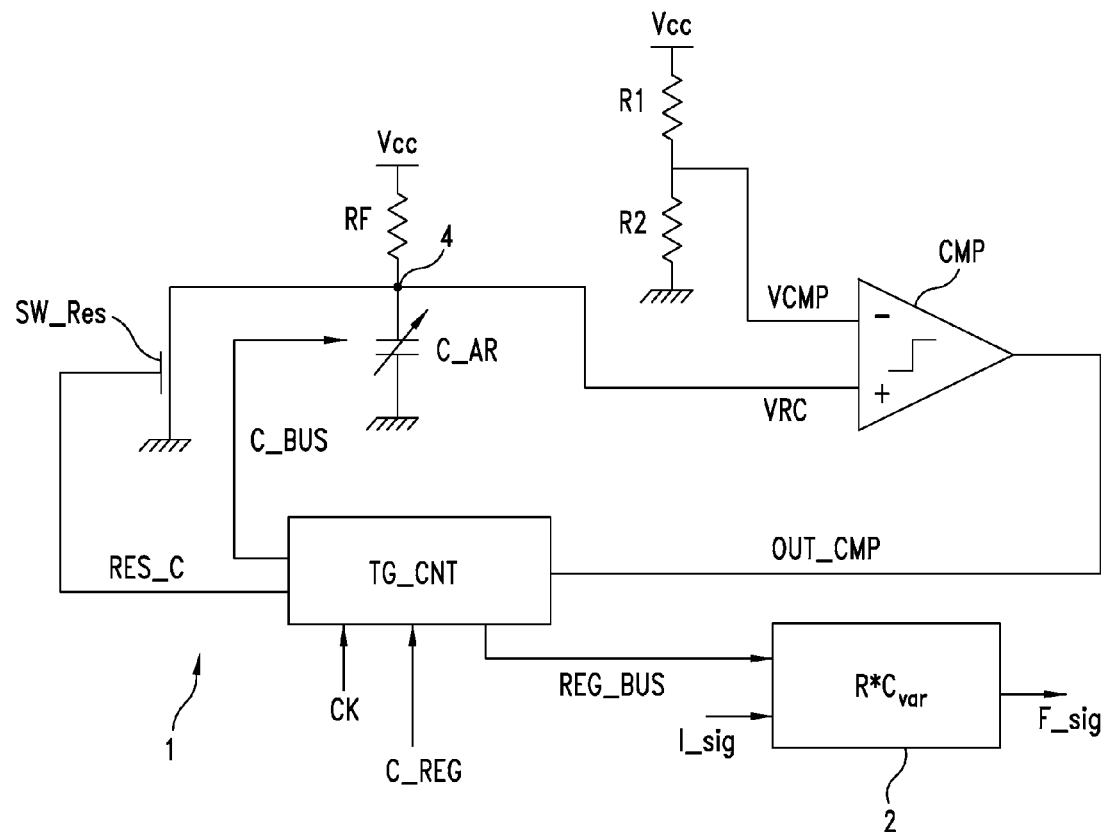
FIG. 1 shows a schematic view of a prior art calibration circuit.
Figure 2A:
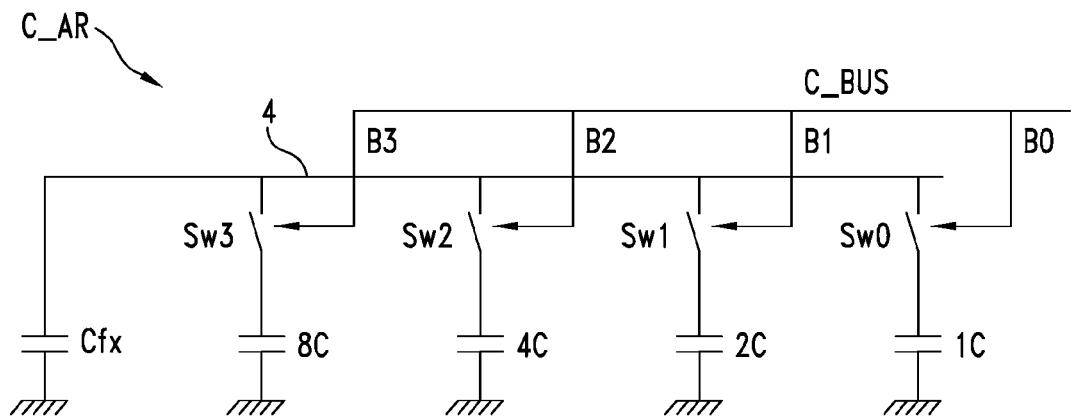
FIG. 2a shows a part of the circuit in FIG. 1 in greater detail.
Figure 2B:
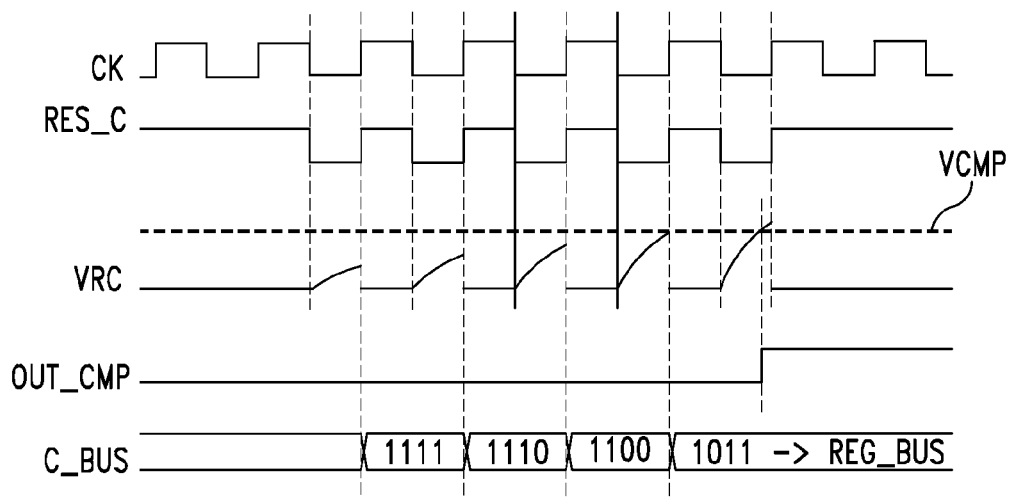
FIG. 2b shows portions of waveforms of signals involved in the operation of the circuit in FIG. 1.

FIG. 4b shows a general circuit diagram of the switched capacitor array C_AR1 of the delay circuit RC_DEL. The other array, i.e., the array C_AR2, is entirely identical to the array C_AR1. It should be observed that in the example in FIG. 4b, the array C_AR1 is structurally identical to the array C_AR already described with reference to the prior art illustrated in FIG. 2a.

In the particular example illustrated herein, only by way of example, the array C_AR1 includes four modular capacitive elements 8C, 4C, 2C, 1C and a fixed capacitor Cfx. The control signal SAR_BUS will be thus a 4-bit signal B3, B2, B1, B0 suitable to control respective switches Sw3, Sw2, Sw1, Sw0. By these switches, the modular capacitive elements 8C, 4C, 2C, 1C can be selectively and independently from each other connected to (i.e., enabled) or disconnected from the node 40 in order to affect (by co-operating with the resistance R), when they are not short-circuited to ground via the switch SW_Res driven by the signal RES_C, the voltage increase transient VRC1 of node 40.

FIG. 5 shows the example time courses of some of the signals involved in the operation of the circuit with reference to FIGS. 3, 4 and 4b.

Upon operation, when the first step of a calibration cycle is started, for example, being started by the control and timing logic unit TG_SAR in response to the request signal C_REG, the control and timing logic unit TG_SAR sends a first control code on the REG_BUS, according to a SAR research technique. In the example, this code is equal to REG_BUS=B3, B2, B1, B0=1, 0, 0, 0. In practice, with reference to FIG. 4b, in the array C_AR1 the switch Sw3 is closed, whereas the remaining switches are opened. In addition to the fixed capacitor Cfx, only the capacitor 8C is thus connected to node 40 (i.e., this capacitor is enabled). At the beginning of the calibration step, the control and timing logic unit TG_SAR via the signal RES_C (RES_C=1) discharges the capacitor Cfx and those capacitors of the switched capacitor arrays C_AR1, C_AR2 enabled by the signal REG_BUS (in this case, the capacitors 8C).

The delay circuit RC_DEL is activated at the falling edge of signal RES_C. In practice, when RES_C goes to 0, the voltage VRC1 of node 40 will start to rise with a time constant depending on resistance R and on the amount of capacitors enabled in the array C_AR1 (at first step: 8C and Cfx). When VRC1 will be equal to the trip voltage of the inverter I1, the inverter I1 and the subsequent inverter I11 will be switched thus bringing the PMOS PM to a cut-off condition. Accordingly, the voltage VRC2 of node 43 may decrease at the same time constant as determined by R and by the enabled capacitor in C_AR1 of the first stage, in that the array C_AR2 has the same amount of enabled capacitors as C_AR1 (identical arrays and identical control signal SAR_BUS).

When the voltage VRC2 will have achieved the trip voltage of inverter I2, the logic signal OUT_DEL will pass from logic level 0 to logic level 1, as illustrated in FIG. 5 (rising edge 51).

With reference to FIG. 5, it is thus understood how the delay circuit RC_DEL has produced a signal OUT_DEL, which has an edge 51 (a rising edge, in the example) delayed by a delay amount d1 relative to the (falling) edge 50 of signal RES_C.

At the falling edge 52 of the clock signal CK, the flip-flop DFF will replicate at its output Q the signal OUT_DEL received at its input D. Accordingly, the flip-flop DFF, by operating as a very high speed digital comparator (in the order of the gate elementary delay), will be such as to output a comparison signal OUT_DFF having a logic level equal to 1, when the delay d1 is lower than the half-period T/2 of clock CK. On the contrary, the flip-flop DFF will not be capable of seeing the excessively delayed edge of signal OUT_DEL, and the comparison signal DFF will remain at logic level 0.

It is thus understood how the signal OUT_DFF is representative of the fact that the signal OUT_DEL has, relative to the half-period T/2 of clock signal CK, an excessive delay or a defective delay.

Consequently, based on the value of signal OUT_DFF, the logic unit TG_CNT will change the signal SAR_BUS at the subsequent step, such as to enable (relative to the preceding step) a higher capacitance value in the arrays C_AR1, C_AR2 if a defective delay has been observed, or on the other hand, a lower capacitance value if an excessive delay has been observed.

As stated above, in a particular embodiment, the control and timing unit TG_SAR is such as to start the various attempts by following a SAR research strategy. In the example in FIG. 5, in fact, it is observed that:
  the first step St_1 is carried out with signal SAR_BUS=B3, B2, B1, B0=1, 0, 0, 0;
  a defective delay (OUT_DFF=1) is observed, and consequently B3=1 is confirmed and B2=1 is set;
  the second step, or attempt, is thus carried out with the signal SAR_BUS=B3, B2, B1, B0=1, 1, 0, 0;
  an excessive delay (OUT_DFF=0) is observed, and consequently B3=1 is confirmed and B2=0 and B3=1 are set;
  the third step St_3 is thus carried out with the signal SAR_BUS=B3, B2, B1, B0=1, 0, 1, 0;
  an excessive delay (OUT_DFF=0) is observed, and consequently B3=1, B2=0 are confirmed and B1=0, B0=1 are set;
  the fourth step, or attempt, is thus carried out with the signal SAR_BUS=B3, B2, B1, B0=1, 0, 0, 1;
  a defective delay (delay d4, OUT_DFF=1) is observed, and consequently B3=1, B2=0, B1=0, B0=1 are confirmed;
  the thus-obtained code SAR_BUS is then sent on the REG_BUS for calibrating the filter 31.

This filter 31 may be provided with an adjustable capacitance $C_{var}$ identical to the switched capacitor array C_AR1, or an array with scaled capacitors relative to the latter. It should be further observed that, in an embodiment, the calibration circuit and the filter can be generally a part of a same integrated circuit to form a complete self-calibrating system.

It should be further observed that, if the total time of the calibration cycle is not a particular system requisite, alternatively to the SAR technique illustrated above, a monotonic research can be used by the control and timing unit TG_SAR, for example by means of a counter, such as described in the above-cited article.

As may be understood from what has been described above, a calibration circuit not requiring the use of analog comparators in the calibration loop may be used in another embodiment.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A calibration circuit for calibrating an adjustable capacitance of a circuit having a time constant depending on said adjustable capacitance, the calibration circuit being adapted to output a calibration signal having information to calibrate said adjustable capacitance, the calibration circuit comprising:
    a calibration loop having:
        a controllable capacitance unit adapted to receive a control signal and including at least one array of switched capacitors that can be activated by the control signal, the controllable capacitance unit being adapted to output a first signal representing a parameter depending on an amount of capacitance of the array activated by the control signal;
        a comparison unit adapted to receive said first signal to assess whether said parameter meets a preset condition and to output a comparison signal representative of a result of said assessment;
        a control and timing logic unit adapted to receive the comparison signal and to change the control signal based on said comparison signal,
    wherein said first signal is a logic signal and said parameter is a time parameter of said first signal.

2. The calibration circuit according to claim 1 wherein the controllable capacitance unit includes a delay circuit with a delay controllable via the switched capacitor array, and wherein the time parameter is a delay of said first signal.

3. The calibration circuit according to claim 2 wherein the delay circuit is adapted to produce in the first signal, in response to a preset edge of a signal applied to its input, an edge having a delay depending on the amount of activated capacitance in the switched capacitor array.

4. The calibration circuit according to claim 2 wherein the delay circuit includes two delay stages, each including a respective switched capacitor array, the delay of the first signal being equal to a sum of two delays produced by the first and second stages, respectively.

5. The calibration circuit according to claim 2 wherein the comparison unit is adapted to check whether the delay is lower than a known half-period of a clock signal.

6. The calibration circuit according to claim 5 wherein the comparison unit includes a D flip-flop having:
    a data input terminal adapted to receive the first signal;
    a control input terminal adapted to receive the clock signal; and
    an output terminal adapted to output, based on the first signal and based on the control signal, the comparison signal.

7. The calibration circuit according to claim 1 wherein the control and timing logic unit includes a Successive Approximation Register and is adapted to change the control signal, during a calibration cycle with several sequential steps, by use of a successive approximation research strategy.

8. A system, comprising:
    a circuit having an adjustable capacitance adapted to adjust a time constant of said circuit; and
    a calibration circuit coupled to said circuit having the adjustable capacitance and adapted to provide a calibration signal to said circuit to adjust said adjustable capacitance, the calibration circuit including:
        a controllable capacitance unit to receive a control signal adapted to activate an amount of capacitance of the controllable capacitance unit, the controllable capacitance unit being adapted to output a first signal representing a time parameter that depends on an amount of capacitance of the array activated by the control signal;
        a comparison unit coupled to said controllable capacitance unit to receive said first signal and adapted to assess whether said time parameter meets a condition and to output a comparison signal representative of a result of said assessment; and
        a control and timing logic unit coupled to said comparison unit and adapted to receive the comparison signal and to change the control signal based on said comparison signal,
    wherein a value of said control signal after an end of a calibration cycle corresponds to a value of said calibration signal, provided by said control and timing logic unit to said circuit having the adjustable capacitance.

9. The system according to claim 8 wherein the circuit having an adjustable capacitance includes a filter having a cut-off frequency depending on the adjustable capacitance.

10. The system according to claim 8 wherein said circuit and said calibration circuit are part of a same integrated circuit.

11. The system according to claim 8 wherein said controllable capacitance unit includes:
    an array of switched capacitors controllable responsive to said control signal to provide said amount of capacitance; and
    a delay circuit coupled to said array and responsive to said amount of capacitance to provide a delay, of said first signal, corresponding to said time parameter.

12. The system according to claim 11 wherein said condition corresponds to whether said delay is lower than a half-period of a clock signal.

13. The system according to claim 8 wherein said comparison unit includes a flip-flop having:
    a first terminal adapted to receive the first signal;
    a second terminal adapted to receive the clock signal; and
    a third terminal adapted to output, based on the first signal and based on the control signal, the comparison signal.

14. A method to calibrate an adjustable capacitance of a circuit having a time constant depending on said adjustable capacitance, the method comprising:
    providing a control signal to activate an amount of capacitance and outputting a first signal representing a time parameter that depends on an amount of capacitance activated by the control signal;
    determining whether said time parameter meets a condition and outputting a comparison signal representative of a result of said determination;
    using said comparison signal to change the control signal, until an end of a calibration cycle is reached wherein a value of said control signal corresponds to a value of said calibration signal; and
    providing said calibration signal to said circuit having the adjustable capacitance to adjust the adjustable capacitance.

15. The method of claim 14 wherein providing said control signal to activate said amount of capacitance includes using said control signal to control an array of switched capacitors that provides said capacitance, and wherein outputting said first signal representing said time parameter includes providing a delay that corresponds to said activated amount of capacitances.

16. The method of claim 15 wherein said condition corresponds to whether said delay is lower than a half-period of a clock signal.

17. The method of claim 14 wherein providing said calibration signal to said circuit includes providing said calibration signal to a filter.

\* \* \* \* \*